United States Patent

Hwang

[19]

[11] Patent Number: 6,067,270
[45] Date of Patent: May 23, 2000

[54] MULTI-BANK MEMORY DEVICES HAVING IMPROVED DATA TRANSFER CAPABILITY AND METHODS OF OPERATING SAME

[75] Inventor: Moon-chan Hwang, Seocho-gu Seoul, Rep. of Korea

[73] Assignee: Samsung Electronics Co., Ltd., Rep. of Korea

[21] Appl. No.: 09/170,940

[22] Filed: Oct. 13, 1998

[30] Foreign Application Priority Data

Nov. 21, 1997 [KR] Rep. of Korea .................. 97-62043

[51] Int. Cl.[7] .................................................. G11C 8/00
[52] U.S. Cl. ........................... 365/230.03; 365/230.06; 365/207; 365/63; 365/51
[58] Field of Search .................. 365/230.03, 230.06, 365/207, 51, 52, 63

[56] References Cited

U.S. PATENT DOCUMENTS

| | | | |
|---|---|---|---|
| 5,594,704 | 1/1997 | Konishi et al. ............ | 365/230.03 X |
| 5,822,268 | 10/1998 | Kirihata ..................... | 365/230.03 |
| 5,870,347 | 2/1999 | Keeth et al. ............... | 365/230.06 X |

OTHER PUBLICATIONS

Steven A. Przybylski, "New DRAM Technologies," pp. 219–222, 1996.

*Primary Examiner*—Huan Hoang
*Attorney, Agent, or Firm*—Myers Bigel Sibley & Sajovec

[57] ABSTRACT

Multi-bank memory devices include at least first and second banks of memory, a first bit line sense amplifier (S/A) electrically coupled to the first bank of memory by a first pair of differential bit lines (BL and /BL), a first pair of differential input/output lines (IO and IOB) and a preferred first switch cell which is responsive to both a first bank select signal ($\phi$YE1) and a first column select signal (CSL1). The first switch cell electrically connects the first pair of differential bit lines to the first pair of differential input/output lines in a preferred sequence to reduce reading errors. The preferred memory devices also include a second bit line sense amplifier electrically coupled to the second bank of memory by a second pair of differential bit lines, a second pair of differential input/output lines and a second switch cell which is responsive to a second bank select signal ($\phi$YE2) and the first column select signal (CSL1). The second switch cell also electrically connects the second pair of differential bit lines to the second pair of differential input/output lines in a preferred sequence to reduce reading errors.

10 Claims, 5 Drawing Sheets

MULTI-BANK MEMORY DEVICES HAVING IMPROVED DATA TRANSFER CAPABILITY AND METHODS OF OPERATING SAME

FIELD OF THE INVENTION

The present invention relates to integrated circuit memory devices and methods of operating same.

BACKGROUND OF THE INVENTION

Conventional synchronous DRAM (SDRAM) devices may include multiple banks of memory cells and operations to write and read data to and from these multiple memory banks may be synchronized to a clock signal. Conventional SDRAM devices may also include a plurality of row decoders so that word lines within each bank of memory cells can be controlled in an interleaved fashion to improve data transfer efficiency. This is unlike other conventional and less efficient DRAM devices which require the deactivation of a word line before activation of another word line. Accordingly, SDRAM devices can typically access and transfer a greater quantity of data at a faster rate than conventional DRAM devices. A conventional multi-bank SDRAM device is also described in a textbook by Steven A. Przybylski, entitled "New Dram Technologies", MicroDesign Resources, ISBN 1-885330-06-5, pp. 219–222 (1996).

Referring now to FIG. 1, a timing diagram which illustrates operation of a multi-bank SDRAM device according to the prior art is provided. In particular, the timing diagram illustrates an interleaved read operation during burst mode operation (with the length of the burst programmed to be 4). The RAS and CAS latencies, which are intervals between the activation of the row and column address strobe signals /RAS and /CAS and the data output DQ, are programmed to be 4 and 1, respectively. Here, the /RAS signal and a row address Ax for bank A are provided to select one of the word lines in bank A, and then a /CAS signal and a column address Ax for bank A are input after a predetermined time period. The data in the selected memory cells in bank A (DA0–DA3) are then output in synchronization with the CLK. Next, the /RAS signal and a row address Ax for bank B are provided to select one of the word lines in bank B, and then a /CAS signal and a column address Ax for bank B are input after a predetermined time period. The data in the selected memory cells in bank B (DB0–DB3) are then output in synchronization with the CLK. Unfortunately, although the data access rate for such conventional SDRAM devices can be increased by providing a row address for bank B while the data DA0–DA3 in bank A is being accessed, such conventional SDRAM devices typically require one row decoder and one column decoder for each memory bank which increases layout area.

Thus, notwithstanding the above-described multi-bank memory devices, there continues to be a need for improved memory devices have efficient data access capability and reduced layout area requirements.

SUMMARY OF THE INVENTION

It is therefore an object of the present invention to provide improved integrated circuit memory devices and methods of operating same.

It is another object of the present invention to provide integrated circuit memory devices which are less susceptible to data transfer errors and methods of operating same.

It is still another object of the present invention to provide integrated circuit memory devices having reduced layout area requirements and reduced power consumption requirements and methods of operating same.

These and other objects, advantages and features of the present invention are provided by multi-bank integrated circuit memory devices which have interleaved data read capability during burst mode operation and reduced susceptibility to reading errors when respective column select lines are used to control multiple banks of memory. In particular, the preferred memory devices include at least first and second banks of memory, a first bit line sense amplifier (S/A) electrically coupled to the first bank of memory by a first pair of differential bit lines (BL and /BL), a first pair of differential input/output lines (IO and IOB) and a preferred first switch cell which is responsive to both a first bank select signal ($\phi$YE1) and a first column select signal (CSL1). The first switch cell electrically connects the first pair of differential bit lines to the first pair of differential input/output lines in a preferred sequence to reduce reading errors.

The preferred memory devices also include a second bit line sense amplifier electrically coupled to the second bank of memory by a second pair of differential bit lines, a second pair of differential input/output lines and a second switch cell which is responsive to a second bank select signal ($\phi$YE2) and the first column select signal (CSL1). The second switch cell also electrically connects the second pair of differential bit lines to the second pair of differential input/output lines in a preferred sequence to reduce reading errors. The memory devices may also include a first pair of differential data lines (DB and /DB), a first input/output line sense amplifier electrically coupled to the first pair of differential input/output lines and the first pair of differential data lines and a second input/output line sense amplifier electrically coupled to the second pair of differential input/output lines and the first pair of differential data lines.

According to another preferred aspect of the present invention, the first switch cell comprises a first pair of pass transistors having gate electrodes electrically connected to a first bank select signal line and a second pair of pass transistors having gate electrodes electrically connected to a first column select signal line. Here, the first pair of pass transistors are electrically connected in series between the first bit line sense amplifier and the second pair of pass transistors and the second pair of pass transistors are electrically connected in series between the first pair of pass transistors and the first pair of differential input/output lines. A preferred second cell is also provided.

A preferred method of operating a multi-bank integrated circuit memory device to improve data transfer capability also comprises the steps of reading a first memory cell in a first bank of memory cells to establish a first differential signal across a first pair of differential bit lines therein and then amplifying the first differential signal to establish a first rail-to-rail signal. A first column select signal (CSL1) is also applied to a first column select signal line and a first bank select signal ($\phi$YE 1) is then applied to a first bank select signal line. A step is then performed to transfer the first rail-to-rail signal from the first pair of differential bit lines to a first pair of differential input/output lines, in response to application of the first column select signal and the first bank select signal. Steps are also performed to read a second memory cell in a second bank of memory cells in an interleaved manner by establishing a second differential signal across a second pair of differential bit lines therein and then amplifying the second differential signal to establish a second rail-to-rail signal. A second bank select signal ($\phi$YE2) is then applied to a second bank select signal line. The second rail-to-rail signal is then transferred from the second pair of differential bit lines to a second pair of differential input/output lines, in response to application of the first column select signal (CSL1) and the second bank select signal (φYE2). Preferably, the step of applying the first column select signal and the step of reading a second memory cell occur during overlapping time intervals and the step of applying a first bank select signal (φYE1) commences after commencement of the step of applying a first column select signal. The step of applying a second bank select signal also commences after commencement of the step of amplifying a second differential signal to reduce the likelihood of data corruption. In addition, the step of applying a first bank select signal commences after commencement of the step of amplifying a first differential signal. Steps are also performed to apply a first word line potential to the first memory cell before the step of applying a first bank select signal and apply a second word line potential to the second memory cell before the step of applying a second bank select signal. Moreover, the step of applying a first bank select signal is preferably synchronized to the step of applying a first word line potential.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete and will fully convey the scope of the invention to those skilled in the art. Like numbers refer to like elements throughout and signal lines and signals thereon may referred to by the same reference symbols.

Figure 1:
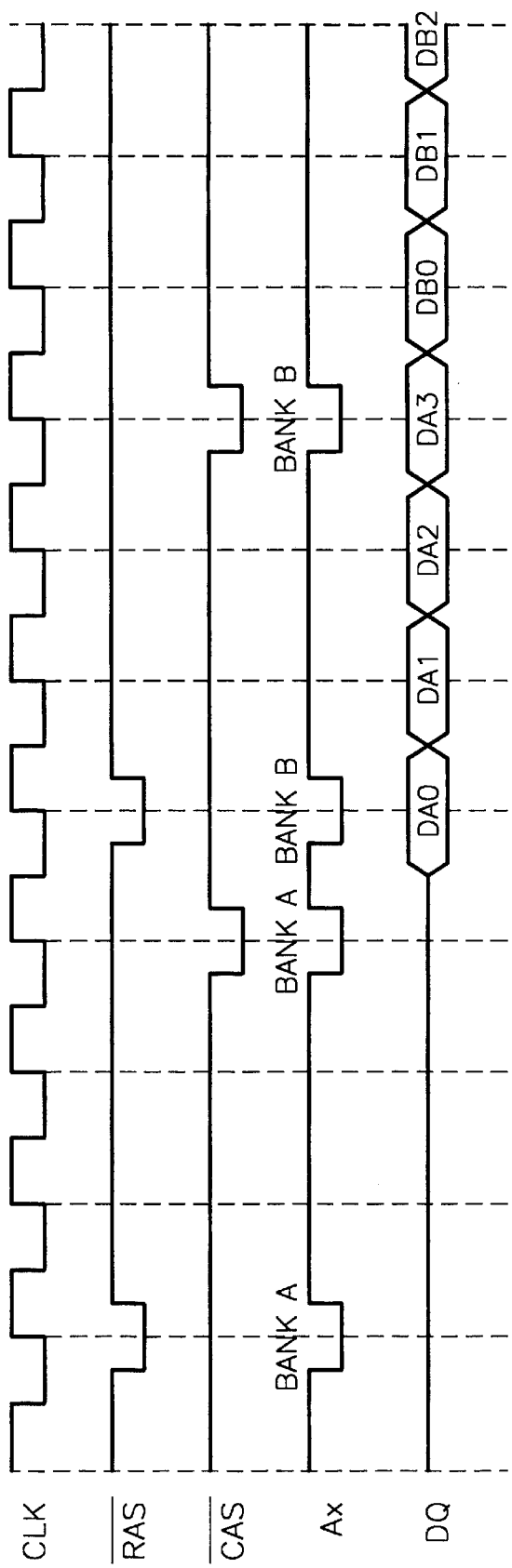
FIG. 1 is timing diagram which illustrates operation of a multi-bank memory device according to the prior art.
Figure 2:
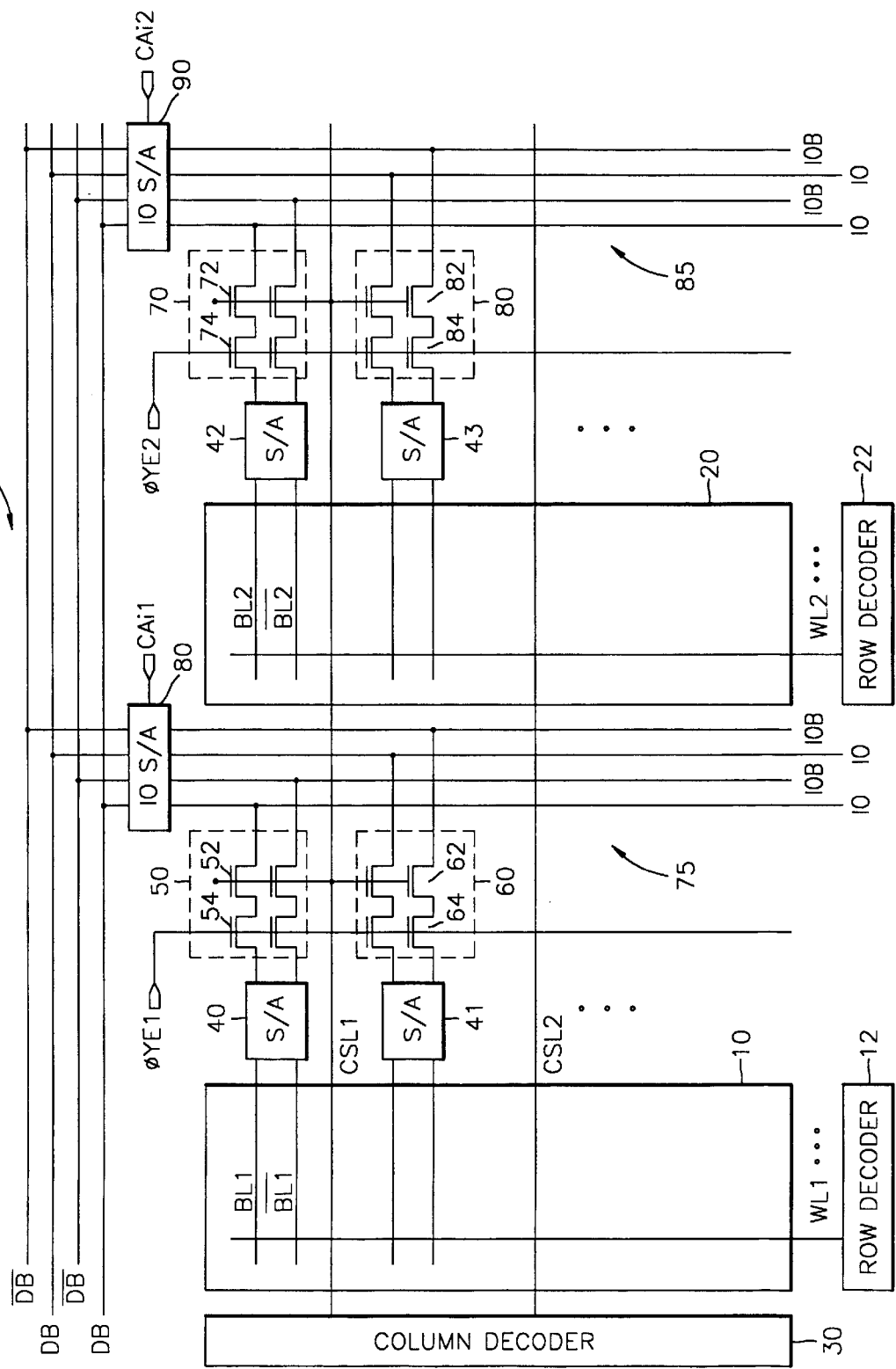
FIG. 2 is an electrical schematic of a multi-bank memory device according to a preferred embodiment of the present invention.

Referring now to FIG. 2, an electrical schematic of a multi-bank memory device 100 according to a preferred embodiment of the present invention will be described. In particular, the preferred memory device 100 comprises a plurality of banks of memory cells including a first bank of memory cells 10 and a second bank of memory cells 20. A single column decoder 30 is also provided for controlling multiple banks of memory instead of just one bank of memory. The column decoder 30 is responsive to column address signals and generates column select (CS) signals on a plurality of column select signal lines (e.g., CSL1–CSL4). These column select signal lines include a first column select signal line CSL1 which spans the plurality of banks of memory cells, as illustrated. First and second row decoders 12 and 22 are also provided. The row decoders are responsive to a row address and generate word line signals on respective word lines (e.g., WL1, WL2). These word lines (WL) are electrically coupled to the first and second banks of memory cells 10 and 20. In particular, each word line may be electrically connected to the gate electrodes of a plurality of access transistors (not shown) in a row of memory cells within each bank. Each column of memory cells within a bank thereof may also be electrically coupled to a pair of differential bit lines (e.g., BL1 and /BL1, BL2 and /BL2). In particular, during a memory reading operation, differential bit line signals may be established on a respective pair of differential bit lines by accessing a selected memory cell (e.g., DRAM cell) within a selected row. As will be understood by those skilled in the art, this memory cell may have dummy memory cell associated therewith to supply a reference potential during the reading operation.

Referring still to FIG. 2, a plurality of bit line sense amplifiers (S/A) are associated with each bank of memory cells. In particular, each of a first plurality of bit line sense amplifiers 40 and 41 is electrically coupled to a respective pair of differential bit lines associated with the first bank of memory cells 10. The construction and operation of the bit line sense amplifiers may be as described in U.S. Pat. No. 5,701,268 to Lee et al., assigned to the present assignee, the disclosure of which is hereby incorporated herein by reference. Similarly, each of a second plurality of bit line sense amplifiers 42 and 43 is electrically coupled to a respective pair of differential bit lines associated with the second bank 20 of memory cells.

As described more fully hereinbelow, each of the pairs of differential bit lines (e.g., BL1 and /BL1, BL2 and /BL2) may be electrically coupled via a respective sense amplifier S/A to a respective pair of differential input/output lines IO and IOB (e.g., local input/output lines) during reading and writing operations, for example. Moreover, a first plurality of pairs of differential input/output lines 75 may become electrically connected to respective pairs of differential data lines DB and /DB (e.g., global input/output lines) by enabling a first IO sense amplifier 80. As illustrated, this first IO sense amplifier 80 is responsive to a first column address signal (shown as Cai1). For example, when the first column address signal CAi1 is set to a logic 1 potential, the first IO sense amplifier 80 operates in a manner similar to the first plurality of bit line sense amplifiers 40 and 41, however, when the first column address signal CAi1 is set to a logic 0 potential, the first plurality of pairs of differential input/output lines 75 become electrically disconnected from the pairs of differential data lines DB and /DB. Likewise, a second plurality of pairs of differential input/output lines 85 may become electrically connected to respective pairs of differential data lines DB and /DB by enabling a second IO sense amplifier 90. As illustrated, this second IO sense amplifier 90 is responsive to a second column address signal (shown as CAi2). For example, when the second column address signal CAi2 is set to a logic 1 potential, the second IO sense amplifier 90 operates like the second plurality of bit line sense amplifiers 42 and 43, however, when the second column address signal CAi2 is set to a logic 0 potential, the second plurality of pairs of differential input/output lines 85 become electrically disconnected from the pairs of differential data lines DB and /DB.

According to a preferred aspect of the present invention, a first switch cell 50 is also provided to electrical connect the first pair of differential bit lines BL1 and /BL1 to a first pair of the first plurality of differential input/output lines 75, in response to a first bank select signal φYE1 and a first column select signal CSL1. Similarly, a second switch cell 60 is provided to electrical connect another pair of differential bit lines in the first bank 10 to a second pair of the first plurality of differential input/output lines 75, in response to the first bank select signal φYE1 and the first column select signal CSL1. As illustrated, the first switch cell 50 includes a pair of bank control switches 54 and a pair of column select switches 52. The illustrated placement of these bank control and column select switches relative to each other may also be reversed. The second switch cell 60 also includes a pair of bank control switches 64 and a pair of column select switches 62. Similarly, a third switch cell 70 is provided to electrical connect the second pair of differential bit lines BL2 and /BL2 to a first pair of the second plurality of differential input/output lines 85, in response to a second bank select signal φYE2 and a first column select signal CSL1. A fourth switch cell 80 is also provided to electrical connect a pair of differential bit lines in the second bank 20 to a second pair of the second plurality of differential input/output lines 85, in response to the second bank select signal φYE2 and the first column select signal CSL1. As illustrated, the third switch cell 70 includes a second pair of bank control switches 74 and a pair of column select switches 72. Similarly, the fourth switch cell 80 includes a pair of bank control switches 84 and a pair of column select switches 82.

Figure 3:
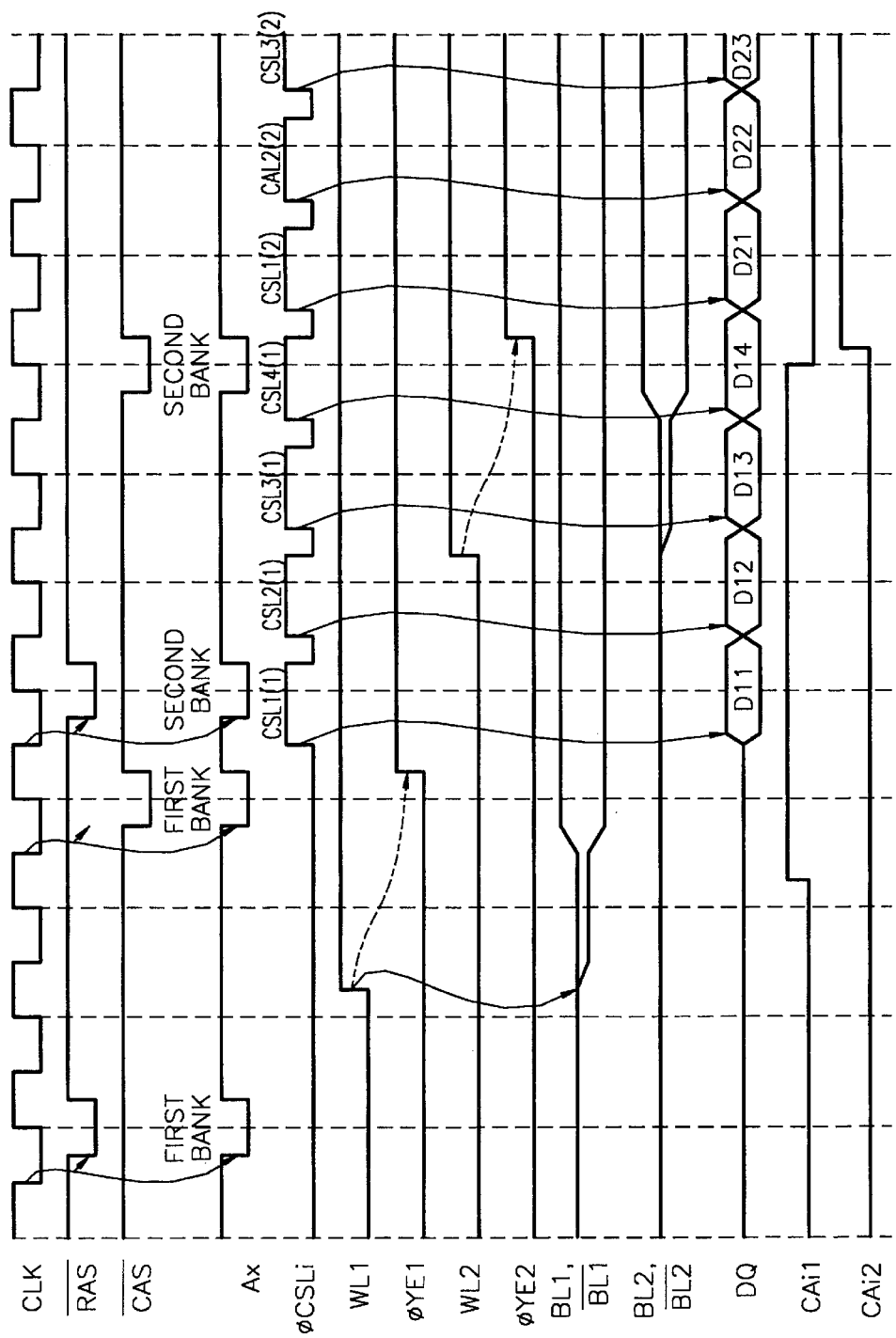
FIG. 3 is a timing diagram which illustrates operation of the multi-bank memory device of FIG. 2.

Referring now to FIG. 3, operations to read data from the first and second banks of memory cells 10 and 20 during burst mode operation, will be described. For illustration purposes, the length of the burst and the RAS and CAS latency are programmed to be 4, 4 and 1, respectively. As illustrated, a first word line WL1 is driven to a logic 1 potential by the first row decoder 12, in response to a /RAS signal and a corresponding row address (Ax) which are synchronized to the memory system clock CLK. Based on techniques well known to those skilled in the art and as described in the aforementioned '268 patent, a relatively small differential signal will then be initially established on a first pair of differential bit lines BL1 and /BL1 (which may be precharged to an intermediate potential), in response to the transition of the first word line WL1 to a logic 1 potential. The polarity of the small differential signal will correspond to the binary value of the data in the selected memory cell and the magnitude of the differential signal will be a function of the internal storage capacitance of each cell relative to the capacitance of the bit line. Based on the illustrated configuration of the memory device 100 and the exemplary burst length of 4, small differential signals will also be established on seven adjacent pairs of differential bit lines in the first bank 10 since eight (8) pairs of bit lines correspond to each block of four column select lines (CSL1–CSL4). The relatively small differential signal on the first pair of differential bit lines BL1 and /BL1 will then be amplified rail-to-rail by the bit line sense amplifier 40. Similarly, the small differential signals on the seven other pairs of differential bit lines will also be amplified by the bit line sense amplifier 41 and six other bit line sense amplifiers (not shown). To inhibit malfunction, it is preferably that the bit lines not be loaded with additional capacitance until the rail-to-rail potentials have been established.

The first, second, third and fourth column select signal lines CSL1, CSL2, CSL3 (not shown) and CSL4 (not shown) are then sequentially enabled in response to the /CAS signal and a corresponding column address (also illustrated as Ax), so that a burst mode read operation can be performed. However, as illustrated, the first bank select signal line φYE1 is driven from 0→1 after the small differential signals on the corresponding bit lines have been amplified.

According to a preferred aspect of the present invention, the first bank select signal φYE1 may be an appropriately delayed version of the first word line signal WL1 (as illustrated by the dotted line between these two signals). Once the first bank select signal line φYE1 and the first column select signal line CSL1 have both been driven to logic 1 potentials, the rail-to-rail differential signals established on the bit lines (which are electrically connected to the first plurality of bit line sense amplifiers 40 and 41) may be passed through each of the pairs of bank control switches 54 and 64 and each of the pairs of column select switches 52 and 62 to the corresponding first plurality of pairs of differential input/output lines 75. Here, the pairs of bank control switches 54 and pairs of column select switches 52 are contained within a first switch cell 50 and the pairs of bank control switches 64 and pairs of column select switches 62 are contained within a second switch cell 60. As illustrated, these switches may comprise MOS transistors. Moreover, by driving the first column address signal CAi1 to a logic 1 potential, these rail-to-rail differential signals can be efficiently transferred to the corresponding pairs of differential data lines DB and /DB. After a sufficient number of clock cycles have passed to transfer data from eight memory cells within the first block 10, the first column address signal CAi1 is driven to a logic 0 potential to isolate the differential data lines DB and /DB from the first plurality of pairs of input/output lines 75. As described more fully hereinbelow, the timing of the first bank select signal line φYE1 and the pairs of bank control switches 54 and 64 within the first and second switch cells 50 and 60 can be used to prevent the transfer of charge from the differential bit lines to corresponding input/output lines when only small differential signals have been established on the differential bit lines (i.e., before sufficient amplification by the corresponding bit line sense amplifier has taken place).

Now, with respect to the second bank of memory cells 20, a second word line WL2 is driven to a logic 1 potential by the second row decoder 22, in response to the /RAS signal and a corresponding row address (Ax). A relatively small differential signal will then be established on a second pair of differential bit lines BL2 and /BL2, in response to the transition of the second word line WL2 to a logic 1 potential. Based on the illustrated configuration of the memory device 100 and the exemplary burst length of 4, small differential signals will also be established on seven adjacent pairs of differential bit lines in the second bank 20. The relatively small differential signal on the second pair of differential bit lines BL2 and /BL2 will then be amplified rail-to-rail by the bit line sense amplifier 42. Similarly, the small differential signals on the seven other pairs of differential bit lines will also be amplified by the bit line sense amplifier 43 and six other bit line sense amplifiers (not shown). The first, second, third and fourth column select signal lines CSL1, CSL2, CSL3 (not shown) and CSL4 (not shown) are then sequentially enabled again in response to the /CAS signal and a corresponding column address (also illustrated as Ax), so that a burst mode read operation can be performed from the second bank 20.

However, as illustrated best by FIG. 3, the second bank select signal line φYE2 is driven from 0→1 after the small differential signals on the corresponding bit lines have been amplified (and before the column select signal lines have been enabled a second time so that reading can take place from the second bank 20). Here, the second bank select signal φYE2 may be an appropriately delayed version of the second word line signal WL2 (as illustrated by the dotted line between these two signals) so that any inadvertent transfer of charge from the differential bit lines in the second bank 20 to the corresponding input/output lines, when only small differential signals have been established on these differential bit lines, can be prevented. This goal can be successfully achieved even though one or more of the first, second, third and fourth column select signal lines CSL1–CSL4 may still be enabled while data is being read from the first memory bank 10.

Then, once the second bank select signal line φYE2 and the first column select signal line CSL1 have been driven to logic 1 potentials, the differential signals established on the bit lines which are electrically connected to the second plurality of bit line sense amplifiers 42 and 43 may be passed through each of the pairs of bank control switches 74 and 84 and each of the pairs of column select switches 72 and 82 to the second plurality of differential input/output lines 85. Here, the pairs of bank control switches 74 and pairs of column select switches 72 are contained within a third switch cell 70 and the pairs of bank control switches 84 and pairs of column select switches 82 are contained within a second switch cell 80. Also, by driving the second column address signal CAi2 to a logic 1 potential, these rail-to-rail differential signals can be efficiently transferred to the corresponding pairs of differential data lines DB and /DB. After a sufficient number of clock cycles have passed to transfer data from eight memory cells within the second block 20, the second column address signal CAi2 is driven to a logic 0 potential to isolate the differential data lines DB and /DB from the second plurality of pairs of input/output lines 85.

Figure 4:
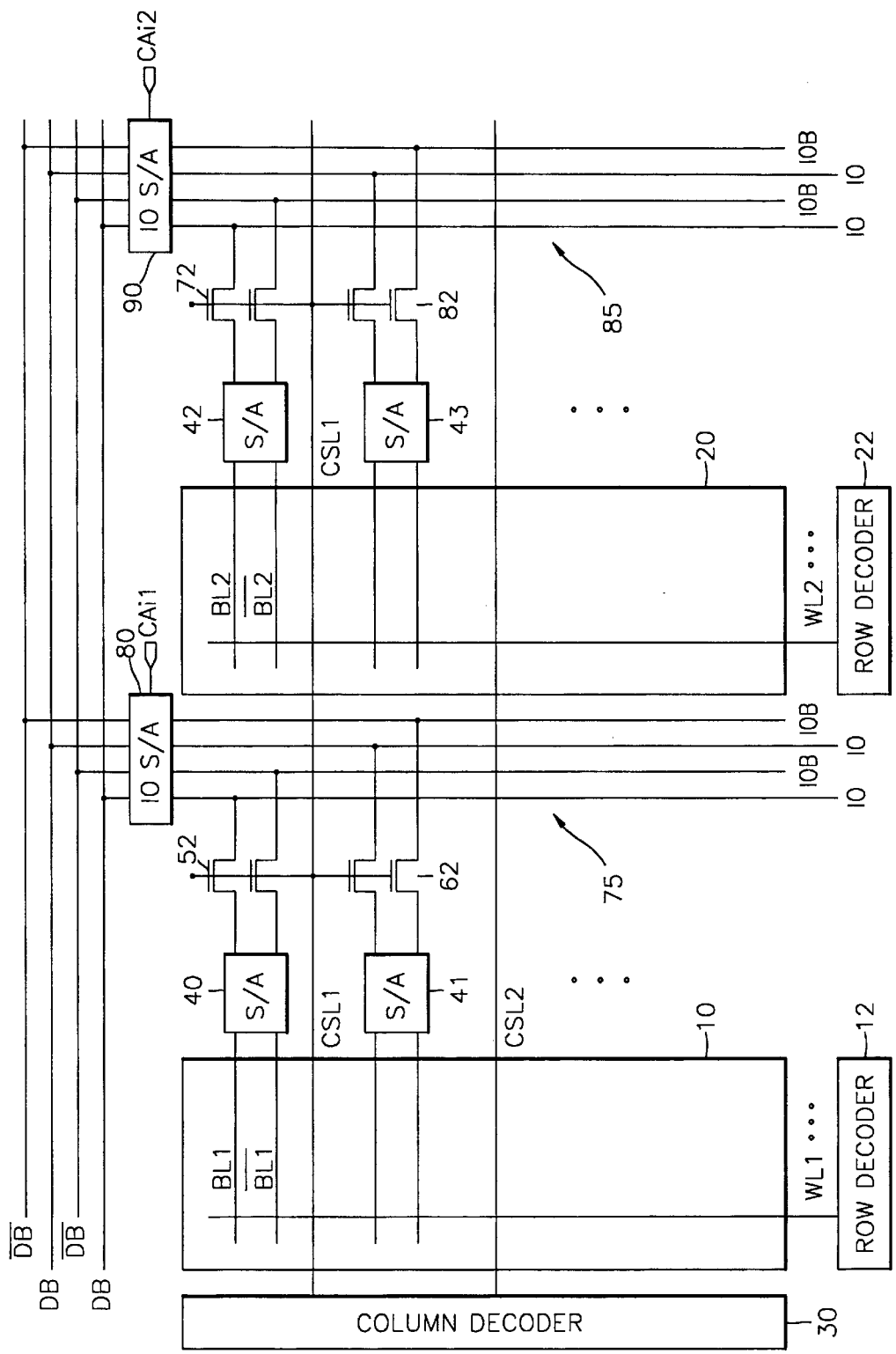
FIG. 4 is an electrical schematic of a multi-bank memory device which may malfunction during reading operations.
Figure 5:
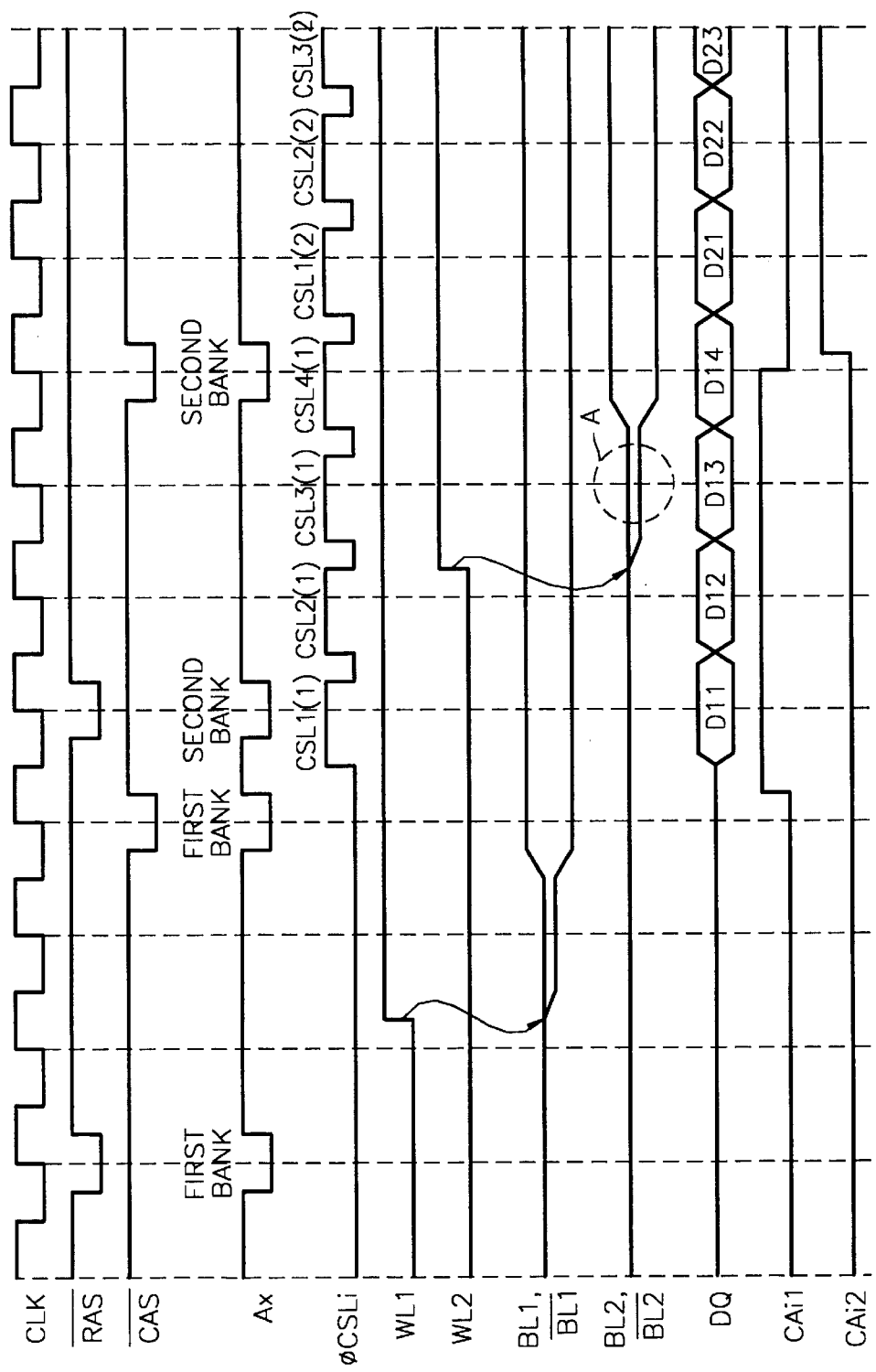
FIG. 5 is a timing diagram which illustrates operation of the multi-bank memory device of FIG. 4.

Referring now to FIG. 4, a less preferred multi-bank integrated circuit memory device omits the bank control switches (54, 64, 74 and 84) illustrated by FIG. 2 and eliminates the generation of the first and second bank select signals φYE1 and φYE2 illustrated by FIG. 3. Accordingly, as illustrated by the timing diagram of FIG. 5, the generation of the third and fourth column select signals CSL3(1) and CSL4(1) (when reading memory cells in the first bank 10) may disturb the magnitude and/or polarity of the small differential signals generated on pairs of differential bit lines in the second bank 20 during the time interval AA@ which is illustrated with respect to the second pair of bit lines BL2 and/BL2. As will be understood by those skilled in the art, such disturbance may lead to data corruption and reading errors.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second banks of memory;
   a first bit line sense amplifier electrically coupled to said first bank of memory by a first pair of differential bit lines;
   a second bit line sense amplifier electrically coupled to said second bank of memory by a second pair of differential bit lines;
   a first pair of differential input/output lines;
   a second pair of differential input/output lines that are electrically disconnected from said first pair of differential input/output lines;
   means, responsive to a first bank select signal and a first column select signal, for electrically connecting the first pair of differential bit lines to said first pair of differential input/output lines; and
   means, responsive to a second bank select signal and the first column select signal, for electrically connecting the second pair of differential bit lines to said second pair of differential input/output lines.

2. The memory device of claim 1, further comprising:
   a first pair of differential data lines;
   a first input/output line sense amplifier responsive to a first column address signal and electrically coupled to said first pair of differential input/output lines and said first pair of differential data lines; and
   a second input/output line sense amplifier responsive to a second column address signal and electrically coupled to said second pair of differential input/output lines and said first pair of differential data lines.

3. The memory device of claim 1, further comprising a first column select signal line; and wherein said means for electrically connecting the first pair of differential bit lines to said first pair of differential input/output lines comprises a first pair of pass transistors having gate electrodes electrically connected to a first bank select signal line and a second pair of pass transistors having gate electrodes electrically connected to the first column select signal line.

4. The memory device of claim 3, wherein the first pair of pass transistors are electrically connected in series between said first bit line sense amplifier and the second pair of pass transistors; and wherein the second pair of pass transistors are electrically connected in series between the first pair of pass transistors and said first pair of differential input/output lines.

5. An integrated circuit memory device, comprising:
   first and second banks of memory having first and second pairs of differential bit lines therein, respectively;
   a first pair of differential input/output lines;
   a second pair of differential input/output lines that are electrically disconnected from said first pair of differential input/output lines;
   a first bank select signal line;
   a second bank select signal line;
   a first column select signal line;
   a first pair of bank control switches electrically coupled to the first pair of differential bit lines and said first bank select signal line;
   a second pair of bank control switches electrically coupled to the second pair of differential bit lines and said second bank select signal line;
   a first pair of column select switches electrically coupled to said first pair of bank control switches, said first pair of differential input/output lines and said first column select signal line; and
   a second pair of column select switches electrically coupled to said second pair of bank control switches, said second pair of differential input/output lines and said first column select signal line.

6. The memory device of claim 5, further comprising:
   a first pair of differential data lines;
   a first input/output line sense amplifier that is responsive to a first column address signal and is electrically coupled to said first pair of differential input/output lines and said first pair of differential data lines; and
   a second input/output line sense amplifier that is responsive to a second column address signal and is electrically coupled to said second pair of differential input/output lines and said first pair of differential data lines.

7. The memory device of claim 5, further comprising:
   a first sense amplifier electrically coupled to the first pair of differential bit lines; and a column decoder electrically coupled to said first column select signal line.

8. The memory device of claim 7, wherein said first sense amplifier is electrically coupled to said first pair of bank control switches.

9. The memory device of claim 8, further comprising a second sense amplifier electrically coupled to the second pair of differential bit lines and said second pair of bank control switches.

10. A method of operating a multi-bank integrated circuit memory device, comprising the steps of:

reading a first memory cell in a first bank of memory cells to establish a first differential signal across a first pair of differential bit lines therein;

reading a second memory cell in the first bank of memory cells to establish a second differential signal across a second pair of differential bit lines therein;

amplifying the first differential signal to establish a first rail-to-rail signal across the first pair of differential bit lines while simultaneously amplifying a second differential signal to establish a second rail-to-rail signal across the second pair of differential bit lines;

applying a first column select signal to a first column select signal line that is electrically connected to first and second column select switches;

applying a first bank select signal to a first bank select signal line that is electrically connect to first and second bank select switches; and transferring the first rail-to-rail signal from the first pair of differential bit lines through the first bank select switches and the first column select switches to a first pair of differential input/output lines while simultaneously transferring the second rail-to-rail signal from the second pair of differential bit lines through the second bank select switches and the second column select switches to a second pair of differential input/output lines, in response to application of the first column select signal and the first bank select signal.

* * * * *